United States Patent
Hirasaki et al.

(10) Patent No.: US 11,280,027 B2
(45) Date of Patent: Mar. 22, 2022

(54) COMPOSITE NITRIDE-BASED FILM STRUCTURE AND METHOD FOR MANUFACTURING SAME

(71) Applicant: Panasonic Intellectual Property Management Co., Ltd., Osaka (JP)

(72) Inventors: Takahide Hirasaki, Kanagawa (JP); Daisuke Suetsugu, Osaka (JP); Takafumi Okuma, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 132 days.

(21) Appl. No.: 16/637,553

(22) PCT Filed: Nov. 21, 2018

(86) PCT No.: PCT/JP2018/042932
§ 371 (c)(1),
(2) Date: Feb. 7, 2020

(87) PCT Pub. No.: WO2019/123954
PCT Pub. Date: Jun. 27, 2019

(65) Prior Publication Data
US 2020/0255977 A1    Aug. 13, 2020

(30) Foreign Application Priority Data

Dec. 21, 2017  (JP) ............................. JP2017-245402
Sep. 5, 2018   (JP) ............................. JP2018-166005

(51) Int. Cl.
*C30B 25/06* (2006.01)
*C30B 29/38* (2006.01)
(Continued)

(52) U.S. Cl.
CPC .......... *C30B 29/38* (2013.01); *C23C 14/0641* (2013.01); *C23C 14/34* (2013.01);
(Continued)

(58) Field of Classification Search
CPC ......... C30B 25/06; C30B 25/18; C30B 29/20; C30B 29/22; C30B 29/36; C30B 29/38; C30B 29/44; C30B 29/42
See application file for complete search history.

(56) References Cited

U.S. PATENT DOCUMENTS 5,122,845 A * 6/1992 Manabe .................. C30B 25/02
                                                252/62.3 GA
5,986,285 A * 11/1999 Yagi ..................... H01L 29/2006
                                                      257/103
(Continued)

FOREIGN PATENT DOCUMENTS

JP       3189877 B    7/2001
JP      2006-013467   1/2006
(Continued)

OTHER PUBLICATIONS

International Search Report of PCT application No. PCT/JP2018/042932 dated Dec. 18, 2018.

*Primary Examiner* — Robert M Kunemund
(74) *Attorney, Agent, or Firm* — Wenderoth, Lind & Ponack, L.L.P.

(57) ABSTRACT

A composite nitride-based film structure includes a bulk single crystal, a plurality of nitride microcrystals, and an amorphous nitride thin film. The plurality of nitride microcrystals is provided on the bulk single crystal, and has a specific orientation relationship with a crystal structure of the bulk single crystal. The nitride thin film is provided on the bulk single crystal, surrounds the nitride microcrystal, and covers a surface of the bulk single crystal.

10 Claims, 6 Drawing Sheets

(51) Int. Cl.
*C30B 29/42* (2006.01)
*C30B 29/44* (2006.01)
*C30B 29/20* (2006.01)
*C23C 14/06* (2006.01)
*C30B 29/22* (2006.01)
*C30B 25/18* (2006.01)
*C23C 14/34* (2006.01)
*C30B 29/36* (2006.01)

(52) U.S. Cl.
CPC .............. *C30B 25/06* (2013.01); *C30B 25/18* (2013.01); *C30B 29/20* (2013.01); *C30B 29/22* (2013.01); *C30B 29/36* (2013.01); *C30B 29/42* (2013.01); *C30B 29/44* (2013.01)

(56) References Cited

U.S. PATENT DOCUMENTS

| | | |
|---|---|---|
| 7,772,599 B2 | 8/2010 | Udagawa |
| 7,981,714 B2 | 7/2011 | Kim et al. |
| 9,190,268 B2 | 11/2015 | Okuno et al. |
| 11,021,788 B2 * | 6/2021 | Okuma ............... C23C 14/0641 |
| 2013/0234157 A1 | 9/2013 | Arena et al. |
| 2014/0217553 A1 | 8/2014 | Arena et al. |

FOREIGN PATENT DOCUMENTS

| | | |
|---|---|---|
| JP | 2006-128627 | 5/2006 |
| JP | 2013-207257 | 10/2013 |
| JP | 2014-500218 | 1/2014 |
| JP | 2014-500219 | 1/2014 |

\* cited by examiner

COMPOSITE NITRIDE-BASED FILM STRUCTURE AND METHOD FOR MANUFACTURING SAME

CROSS-REFERENCE TO RELATED APPLICATIONS

This application is a U.S. national stage application of the PCT International Application No. PCT/JP2018/042932 filed on Nov. 21, 2018, which claims the benefit of foreign priority of Japanese patent application 2018-166005 filed on Sep. 5, 2018 and Japanese patent application 2017-245402 filed on Dec. 21, 2017, the contents all of which are incorporated herein by reference.

TECHNICAL FIELD

The present invention relates to a composite nitride-based film structure and a method for manufacturing the same.

BACKGROUND ART

In the wake of a reduction of carbon dioxide emissions or prohibition of mercury use in accordance with the Minamata Convention, the application of a nitride semiconductor to a power device for power control or an emission device as a general lighting is expected.

Since there is no initial substrate for lattice matching of a nitride semiconductor, nitride semiconductor crystals are prepared on a thin film, a sapphire ($\alpha$-$Al_2O_3$) without relying on bulk crystals, or different bulk single crystals such as SiC, Si, and $ScAlMgO_4$. As a method for crystal growth, an organic metal vapor phase growth method (MOCVD method), a molecular beam epitaxy method (MBE method), a hydride vapor phase growth method (HVPE method), a sputtering method, and the like are generally known.

However, even in a case where nitride semiconductor crystals are formed by any of the methods, lattice constants of nitride semiconductors are different in a case of using the above-described bulk crystals as an initial substrate, and the difference in the lattice constants become a problem. Due to lattice mismatching, a lot of defects occur in the nitride semiconductor crystals, and this becomes a main factor of causing deterioration of efficiency or life of a device due to quality deterioration of the nitride semiconductor crystals. In order to solve such a problem, Epitaxial Lateral Overgrowth (hereinafter, referred to as "ELO method"), which is a method of growing a nitride semiconductor not having crystal defects by selectively performing lateral growth, is known.

Figure 6A:
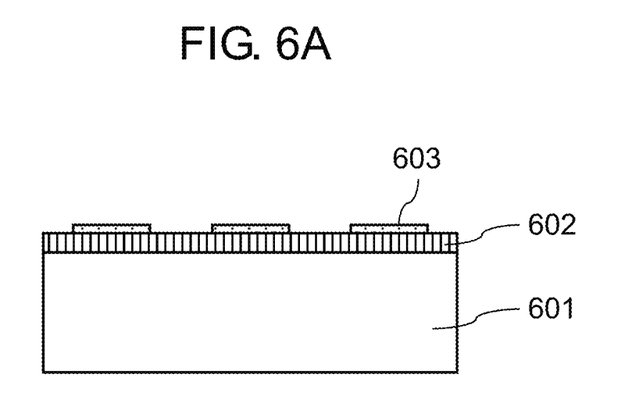
FIG. 6A is a schematic sectional view illustrating a sectional structure of a substrate used by an ELO method in the related art.
Figure 6B:
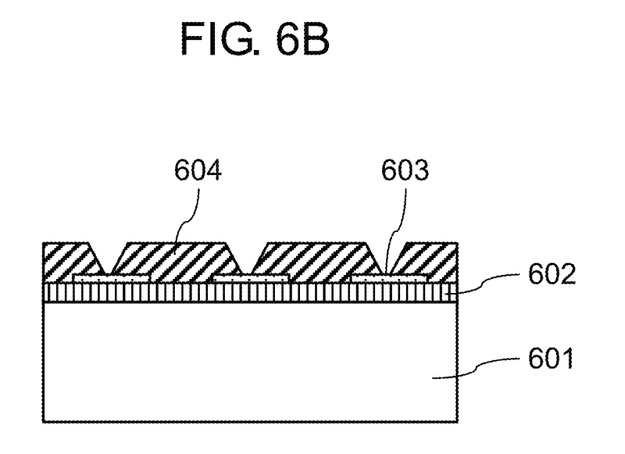
FIG. 6B is a schematic sectional view illustrating a state in a case where crystal growth was performed on the substrate of FIG. 6A.

The ELO method will be described referring to FIGS. 6A and 6B that illustrate a substrate in a sectional direction. FIG. 6A is a sectional view in a sample before performing crystal growth by the ELO method. FIG. 6B is a sectional view in a sample during growth. In the ELO method, an underlayer (buffer layer) processed on a seed crystal substrate is used. Specifically, as illustrated in FIG. 6A, an underlayer provided with a mask 603 having a periodic opening formed of $SiO_2$ or SiN which is an amorphous material on crystalline thin film 602 formed on bulk single crystal wafer 601 is used as an initial substrate.

Figure 7A:
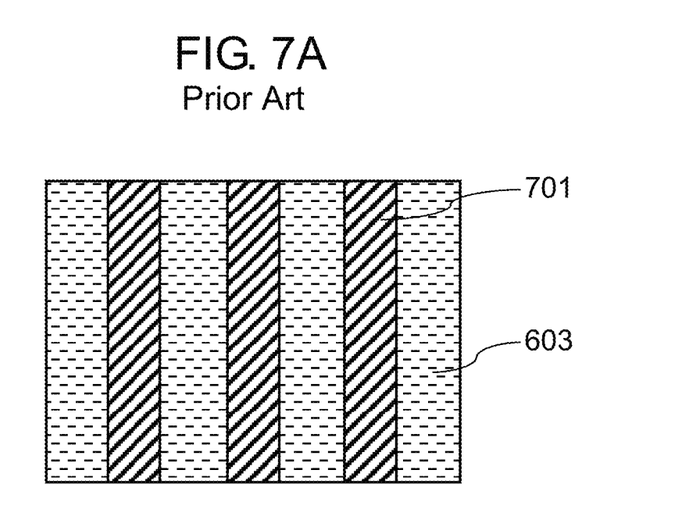
FIG. 7A is a plan view illustrating an example of a mask processing pattern used by the ELO method in the related art.
Figure 7B:
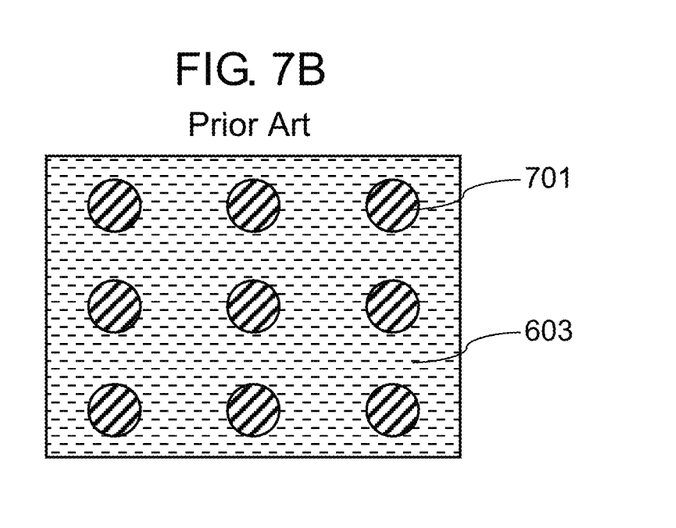
FIG. 7B is a plan view illustrating another example of a mask processing pattern used in the ELO method in the related art.

FIG. 7A is a plan view illustrating the sectional view illustrated in FIG. 6A viewed from above. In mask 603, opening 701 may be in a stripe pattern as illustrated in FIG. 7A, or opening 701 may be in a dot pattern as illustrated in FIG. 7B. The size or pitch of the mask opening is 2 µm to 10 µm, inclusive in many cases. In a case where crystal growth was performed on a substrate subjected to mask processing as in FIG. 6A, adsorption of raw material molecules on amorphous mask 603 becomes unreliable. For this reason, crystal growth having a site just above mask 603 as a starting point does not proceed, and crystal growth having only the mask opening as a starting point proceeds. In accordance with the proceeding of crystal growth, lateral growth is performed such that crystal 604 grown by having the mask opening as a starting point as in FIG. 6B covers mask 603. Finally, a crystal film uniformly continued on a substrate is formed by crystal 604 completely covering mask 603. At this time, crystal defects propagate crystals growth continuous from the mask opening. By lateral growth, a propagation direction is bent from a vertical direction to a substrate surface to a parallel direction, and meets with crystals growth in a lateral direction than an adjacent opening to form a dislocation loop. With this, dislocation is reduced. Since nitride crystals prepared by using the ELO method in this way can have a dislocation density of $10^6$ $cm^{-2}$ to $10^7$ $cm^{-2}$, compared to $10^9$ $cm^{-2}$ in a case of not using the ELO method, it is possible to reduce the dislocation density by two or more digits.

An important point in the ELO method is to use an initial substrate in which mask 603 and opening 701 are periodically formed on a substrate surface as a Line and Space pattern as illustrated in FIG. 7A or a dot pattern as illustrated in FIG. 7B. It is possible to accelerate lateral growth by exposed opening 701 of the substrate surface of which size or pitch is controlled and mask 603 formed of an amorphous substance of which crystal growth does not proceed, and to grow high-quality nitride crystals.

SUMMARY OF THE INVENTION

The composite nitride-based film structure of the present disclosure has a bulk single crystal, a plurality of nitride microcrystals, and an amorphous nitride thin film. The plurality of nitride microcrystals is provided on the bulk single crystal, and has a specific orientation relationship with a crystal structure of the bulk single crystal. The nitride thin film is provided on the bulk single crystal, surrounds the nitride microcrystal, and covers a surface of the bulk single crystal.

In addition, a method for manufacturing the composite nitride-based film structure of the present disclosure includes
a step of preparing a bulk single crystal substrate and a target material in a vacuum chamber of a sputtering device and a step of introducing gas containing 30% or more of nitrogen in the vacuum chamber,
applying a power pulse of which a proportion of time applying power at a frequency of 1 kHz to 100 kHz is 0.1% to 30%, under a pressure of 0.1 Pa to 0.5 Pa and at a temperature of the bulk single crystal substrate of 25° C. to 1000° C., to generate a plasma, and
forming a plurality of nitride microcrystals and an amorphous nitride thin film surrounding the plurality of nitride microcrystals and covering the entire surface of the bulk single crystal substrate, on the bulk single crystal substrate by a reactive sputtering method.

DETAILED DESCRIPTION OF A PREFERRED EMBODIMENT

Although the ELO method is a useful method in preparing crystals having a low dislocation density, a base substrate for use in the ELO method is prepared, and thus lots of film formings or processings are required. For this reason, there are problems in cost for introducing and maintaining equipment to perform film forming or processing and in productivity for including a lot of steps. First, regarding the equipment cost, equipment for preparing crystalline thin film 602 by the MOCVD method or the MBE method which serves as a base, equipment for chemical vapor growth (CVD) or sputtering for forming mask 603 formed of $SiO_2$ or SiN, and equipment for lithography or etching using fluorinated acid for preparing opening 701 of mask 603 are essential. The CVD uses flammable raw materials in many cases, and thus is dangerous and expensive. In addition, a detoxifying device, for example, a CVD device having an exhaust gas treatment device or an exposure device for lithography is also extremely expensive, and thus becomes a cause of significantly increasing production costs. Regarding productivity, the ELO method includes a lot of steps such as film forming, exposure, and etching, and thus significantly increases time required for production.

A composite nitride-based film structure of the present disclosure is a composite nitride-based film structure including a nitride thin film formed on a bulk single crystal wafer, and is formed of a nitride microcrystal provided on a bulk single crystal wafer having a specific orientation relationship with a crystal structure of the bulk single crystal wafer and an amorphous nitride thin film surrounding the nitride microcrystal and covering a surface of the bulk single crystal wafer.

The composite nitride-based film structure may have a flat upper surface.

In the composite nitride-based film structure, an arithmetic average roughness of the upper surface may be 0.1 nm to 10 nm, inclusive.

The composite nitride-based film structure may be formed of binary or more elements in which one or more metal elements among Al, Ga, and In are nitrided.

In the composite nitride-based film structure, an interval between nitride microcrystals may be 5 nm to 50 μm, inclusive.

In the composite nitride-based film structure, a film thickness may be 5 nm to 100 nm, inclusive.

The composite nitride-based film structure may be formed on any bulk single crystal wafer selected from the group consisting of sapphire ($\alpha$-$Al_2O_3$), Si, SiC, GaP, GaAs, ZnO, MgO, and $ScAlMgO_4$.

A method for manufacturing a composite nitride-based film structure of the present disclosure includes a step of preparing a bulk single crystal substrate and a target material in a vacuum chamber of a sputtering device and a step of introducing gas containing 30% or more of nitrogen in the vacuum chamber, under a pressure of 0.1 Pa to 0.5 Pa and at a temperature of the substrate of 25° C. to 1000° C., applying a power pulse of which a proportion of time applying power at a frequency of 1 kHz to 100 kHz is 0.1% to 30% to generate a plasma, and forming nitride microcrystals and an amorphous nitride thin film surrounding the nitride microcrystals and covering the entire surface of the bulk single crystal substrate on the substrate by a reactive sputtering method.

In the method for manufacturing a composite nitride-based film structure, a pulsed direct current may be supplied for generating a plasma when performing the reactive sputtering that forms a thin film on a substrate by reacting the target material and gas in the reactive sputtering.

Hereinafter, referring to drawings, the composite nitride-based film structure and the method for manufacturing the same of the embodiment will be described in detail. Substantially like members are denoted by like reference numerals in drawings.

Embodiment

<Composite Nitride-Based Film Structure>

Figure 1A:
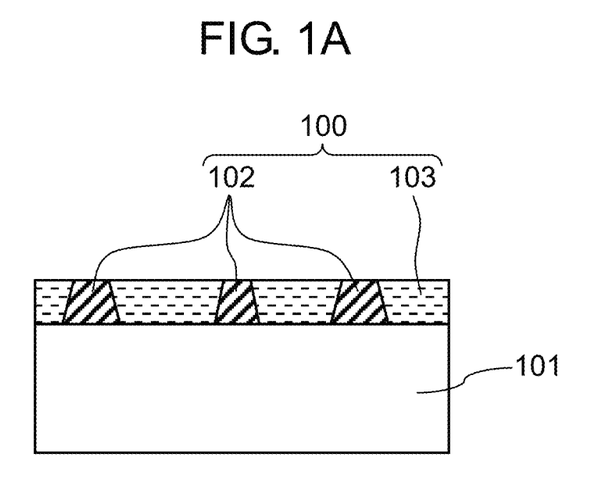
FIG. 1A is a schematic sectional view illustrating a sectional structure of a composite nitride-based film structure according to an embodiment.
Figure 1B:
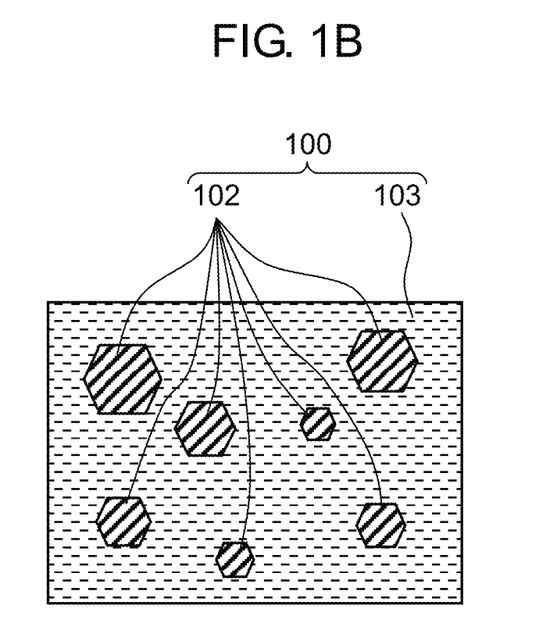
FIG. 1B is a plan view of the composite nitride-based film structure according to the embodiment.

First, mainly referring to FIGS. 1A and 1B, composite nitride-based film structure 100 of the embodiment will be described. FIG. 1A is a schematic sectional view illustrating a sectional structure of a laminate obtained by laminating composite nitride-based film structure 100 on bulk single crystal wafer 101 of the embodiment. FIG. 1B is a plan view of composite nitride-based film structure 100 of FIG. 1A. Composite nitride-based film structure 100 is provided on bulk single crystal wafer 101, and is configured of a composite between nitride microcrystal 102 having a specific orientation relationship with a crystal structure of a bulk single crystal and provided on the bulk single crystal wafer and amorphous nitride thin film 103 formed of the same material as that of the nitride microcrystal. A plurality of nitride microcrystals 102 is disposed on bulk single crystal wafer 101. Each of the plurality of nitride microcrystals 102 is a single crystal, for example. Each of the plurality of nitride microcrystals 102 has a specific orientation relationship with the crystal structure of the bulk single crystal and is provided on the bulk single crystal wafer. That is, directions of crystal axes of the plurality of nitride microcrystals 102 coincide with each other.

Figure 2A:
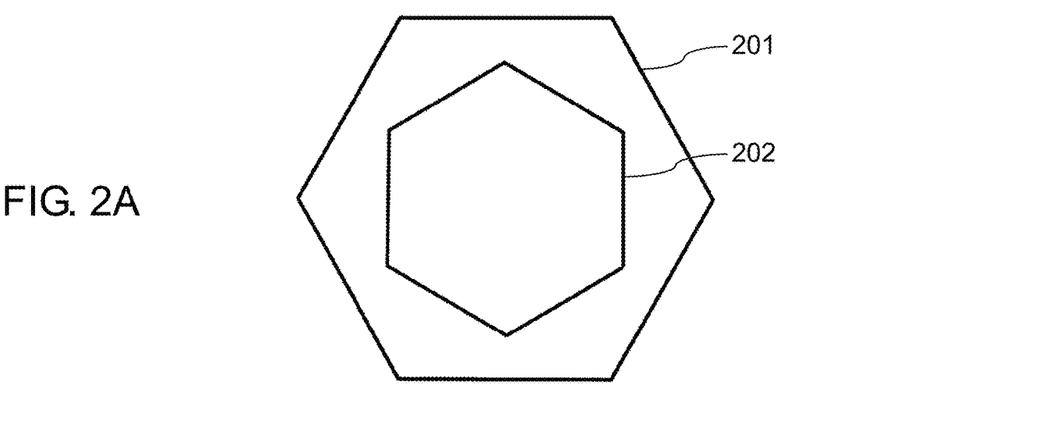
FIG. 2A is a view illustrating an orientation relationship between a bulk single crystal wafer and a nitride microcrystal according to the embodiment.
Figure 2B:
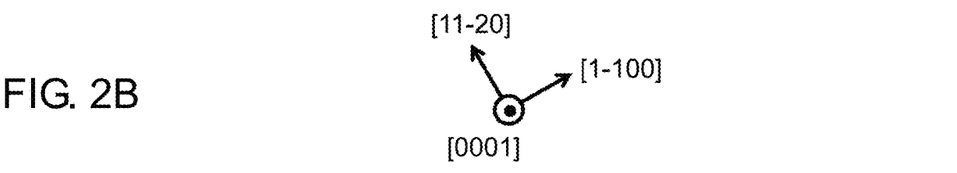
FIG. 2B is a view illustrating a crystal axis in a case where the bulk single crystal wafer is sapphire in FIG. 2A.
Figure 2C:
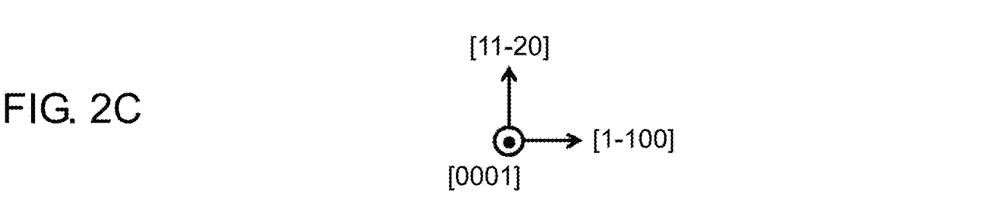
FIG. 2C is a view illustrating a crystal axis in a case where the nitride microcrystal is AlN in FIG. 2A.
Figure 2D:
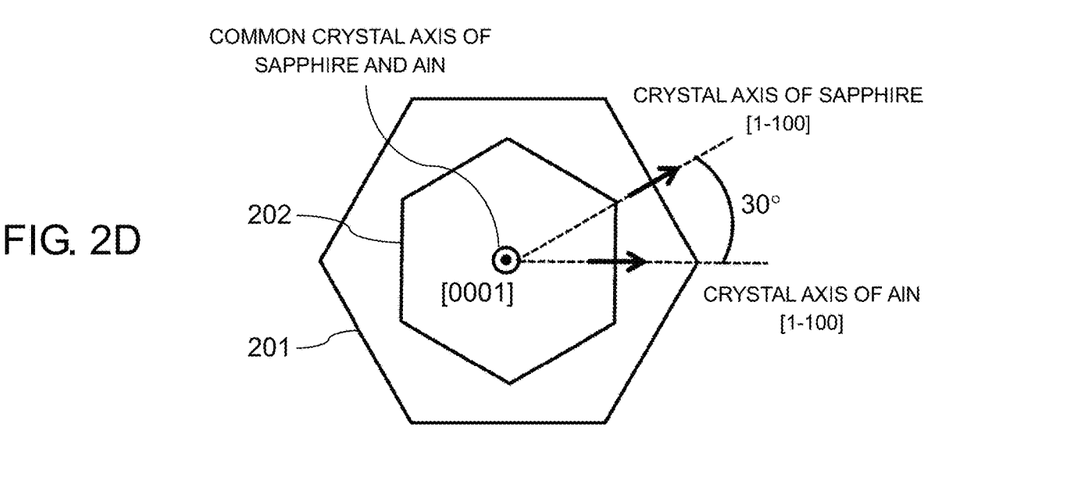
FIG. 2D is a schematic view illustrating an orientation relationship between axis of sapphire and of AlN of FIG. 2B and FIG. 2C.

Here, the nitride microcrystal having a specific orientation relationship with the crystal structure of the bulk single crystal wafer and provided on the bulk single crystal wafer will be described using FIGS. 2A to 2D. FIG. 2A is a schematic view representing an orientation relationship between the single crystal bulk wafer and the microcrystal in a case where a sapphire (0001) substrate is used as a bulk single crystal wafer and AlN (aluminum nitride) is used as a nitride microcrystal. FIG. 2B is a view illustrating a crystal axis in a case where the bulk single crystal wafer is sapphire. FIG. 2C is a view illustrating a crystal axis in a case where the nitride microcrystal is AlN. Sapphire has a corundum-type crystal structure, and unit lattice 201 thereof can be represented by a hexagonal prism. In addition, AlN has a wurtzite-type crystal structure, and unit lattice 202 thereof also can be represented by a hexagonal prism. FIGS. 2A and 2D illustrate a plan view viewed from above, in which [0001] axes of the hexagonal prisms of the unit lattices overlap to coincide with each other. Here, first, the specific orientation relationship is an orientation relationship in which the directions of the crystal axis [0001] of sapphire and the crystal axis [0001] of AlN coincide with each other. It may be an orientation relationship in which the [1-100] axis of AlN is rotated by 30° with respect to the [1-100] axis of sapphire. That is, as illustrated in FIG. 2D, it is a state where the [0001] axis is rotated by 30° and on top in a state where a core axis of the unit lattice of sapphire coincides with a core axis of the unit lattice of AlN.

In addition, an example of another orientation relationship includes a case where a combination of a wurtzite structure is selected, such as using a (0001) plane of ZnO (zinc oxide) as a single crystal bulk wafer and selecting AlN as a nitride microcrystal. In this case, it is an orientation relationship in which the [0001] direction of the wurtzite and the [1-100] axis coincide with each other. That is, it is a state where each of the unit lattice makes the [0001] axis and the [1-100] axis to coincide with each other and is on top without rotating (not illustrated).

In addition, an amorphous nitride thin film formed of the same material as that of the nitride microcrystal is a compound configured of the same composition as that of a specific fixed nitride microcrystal, and refers to a nitride thin film of an amorphous structure not having a certain crystal structure.

Since nitride microcrystal 102 is spontaneously formed in a film forming process, an interval between microcrystals or a size can be controlled by process conditions in the method for manufacturing a composite nitride-based film structure to be described later. The composite nitride-based film structure can be also formed by the MOCVD method or MBE method, or the HVPE method. However, the MOCVD method or MBE method, or the HVPE method is a method in which crystals grow by migration on a substrate of which temperature is high. From this, in the method, a surface roughness of crystals formed on a single crystal bulk wafer which is a substrate is sensitively changed by a growth rate, a substrate temperature, or other formation conditions, and it is difficult to control both of a crystal state and flatness. On the other hand, in the sputtering method, since a substrate temperature is comparatively low, a distance of migration is small and it is easy to form a flat film. By the sputtering method, it is possible to form a thin film having an arithmetic average roughness Ra of 0.1 nm to 10 nm, inclusive. That is, an upper surface of the composite nitride-based film structure of the present disclosure is preferably flat (planar). Here, the upper surface of the composite nitride-based film structure is a plane configured of an upper surface of a plurality of nitride microcrystals and an upper surface of a nitride thin film. In addition, in the composite nitride-based film structure of the present disclosure, the arithmetic average roughness of the upper surface is preferably 0.1 nm to 10 nm, inclusive. In particular, in the formed thin film, in-plane uniformity or flatness of a film thickness is excellent and cost of production equipment is reliable, and thus it is desirable to perform film forming of the composite nitride-based film structure by the sputtering method.

<Sputtering Device>

Figure 3:
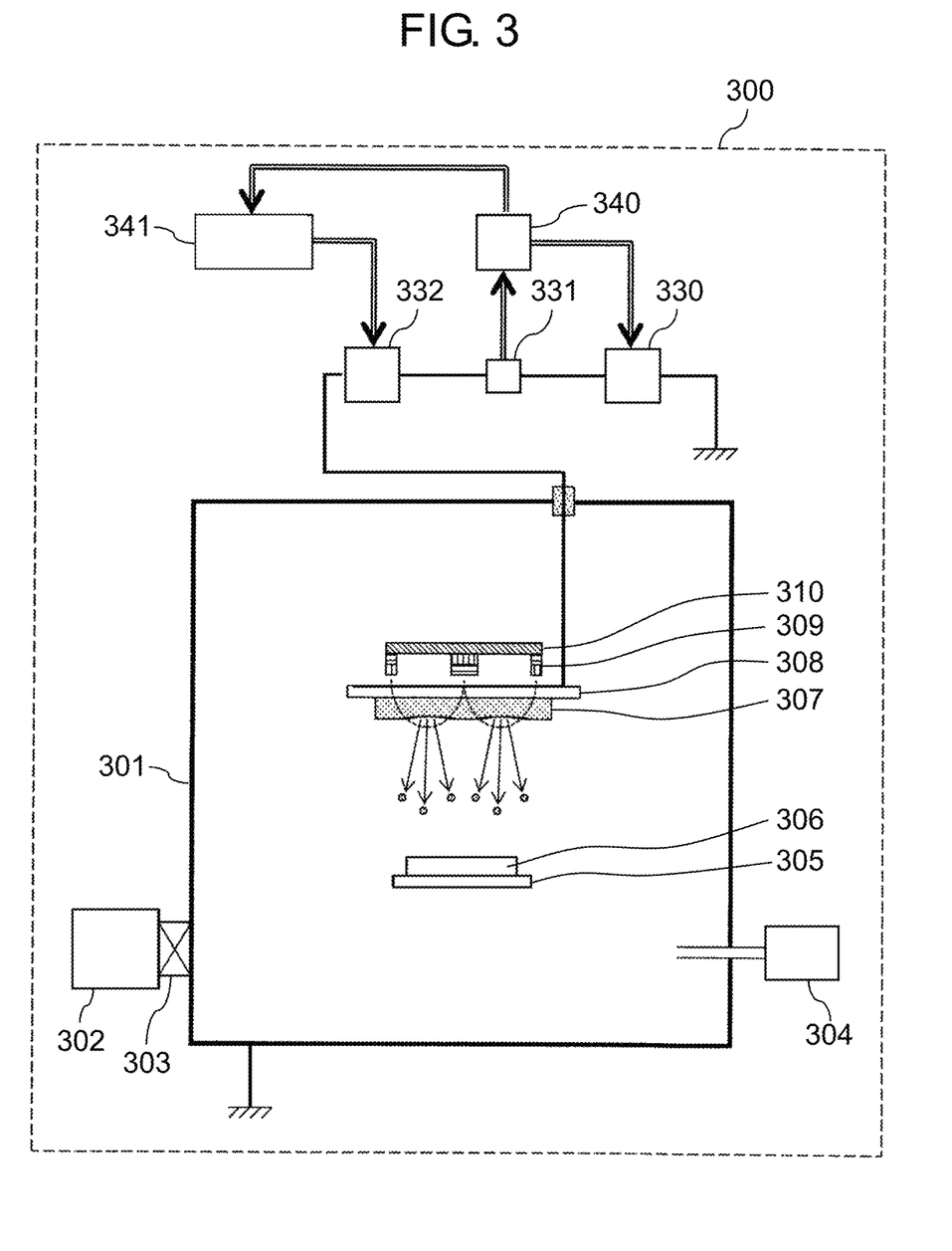
FIG. 3 is a schematic view illustrating a configuration of a sputtering device according to the embodiment.

Subsequently, sputtering device 300 for forming the composite nitride-based film structure according to the embodiment will be described. FIG. 3 is a schematic view illustrating a configuration of sputtering device 300 according to the embodiment. Sputtering device 300 includes vacuum chamber 301, vacuum pump 302, gas supply source 304, baking plate 308, direct current power source 330, pulsed unit 332, power source controller 340 as an example of a control portion, pulse controller 341, and substrate holder 305.

Vacuum chamber 301 can perform pressure reduction into a vacuum state by exhausting gas through vacuum pump 302 connected via gate valve 303.

Gas supply source 304 can supply gas required for sputtering to vacuum chamber 301 at a constant rate. As gas supplied from gas supply source 304, gas having reactivity with a target material such as nitrogen and oxygen, or a mixture gas between gas having reactivity and rare gas such as inactive argon can be selected, for example.

Gate valve 303 can control a degree of vacuum in vacuum chamber 301 at a desirable gas pressure by changing an opening and closing rate thereof.

In FIG. 3, in an upper portion of vacuum chamber 301, target material 307 is disposed. Target material 307 is an optional sputtering material, but is an inorganic material such as a metal material forming a nitride and a semiconductor material, for example. In a case of the present embodiment, target material 307 is Al having a high purity (6N: 99.9999%).

Baking plate 308 is disposed in the upper portion of vacuum chamber 301, and supports target material 307 so as to oppose substrate holder 305 to be described later.

Direct current power source 330 is electrically connected to target material 307 via pulsed unit 332 and baking plate 308, and can apply voltage to target material 307. Pulsed unit 332 accumulates a direct current generated by direct current power source 330 in a built-in capacitor and the like, and can be pulsed by being turned on or off by a built-in semiconductor switch element and the like. Pulsed unit 332 is controlled by pulse controller 341, and direct current power source 330 and pulse controller 341 are controlled by power source controller 340. In addition, current from direct current power source 330 to pulsed unit 332 is measured by ammeter 331, and a measured current value is fed back to power source controller 340. That is, in power source controller 340, direct current power source 330 is feed-back controlled such that the current value measured by ammeter 331 becomes a predetermined value.

Magnet 309 and yoke 310 are disposed on a back surface of baking plate 308 in the upper portion of vacuum chamber 301, and can generate a magnetic field on a surface of target material 307. Magnet 309 may be one or more. Magnet 309 may be any of a permanent magnet and an electromagnet. Yoke 310 is connected to an end of magnet 309, constitutes a magnetic circuit, and can suppress leakage of an unnecessary magnetic field to an opposite side to target material 307.

In FIG. 3, in a lower portion of vacuum chamber 301, substrate holder 305 supporting substrate 306 is disposed. Substrate holder 305 is disposed on a lower portion of substrate 306, and supports substrate 306 so that a surface of substrate 306 opposes a surface of target material 307 supported by baking plate 308.

<Method for Manufacturing Composite Nitride-Based Film Structure>

Subsequently, a method for manufacturing a composite nitride-based film structure according to the present embodiment, that is, a film forming procedure of the composite nitride-based film structure will be described.

(1) First, substrate input is performed. At a position of substrate 306 of FIG. 3 described above, substrate 306 on which film is easily formed, for example, sapphire (0001) substrate ("bulk single crystal wafer") is mounted. Regarding mounting of substrate 306, there is a case where vacuum chamber 301 is open to the atmosphere and directly mounted with a hand, or there is also a case where vacuum chamber 301 is not open to the atmosphere and mechanically mounted by using a robot arm from a load lock chamber and the like.

(2) Subsequently, vacuum pump 302 is activated to perform pressure reduction so that the inside of vacuum chamber 301 is in a vacuum state, after vacuum chamber 301 reaches a predetermined degree of vacuum, gas is introduced thereto from gas supply source 304, and a degree of opening of gate valve 303 is adjusted so as to obtain a predetermined gas pressure.

(3) When a gas flow rate and a pressure are stabilized, power is applied and plasma is generated to start film forming. In this case, film forming between a nitride microcrystal and an amorphous nitride thin film is performed in one stage. As the film forming condition, for example, gas containing 30% or more of nitrogen is introduced in a vacuum chamber, and the pressure is set to be 0.1 Pa to 0.5 Pa. In addition, a temperature of the substrate is 25° C. to 1000° C. Moreover, at a frequency of 1 kHz to 100 kHz, a power pulse of which time proportion of applying power is 0.1% to 30% is applied to generate a plasma. Under the above condition, after film forming is performed for an optional time to obtain a desirable film thickness, the substrate is taken out and a series of actions are finished.

As described above, it is possible to perform film forming of a nitride-based film structure onto substrate 306 which is a bulk single crystal wafer.

Subsequently, a method for evaluating a composite nitride-based film structure on which film is formed by the above-described sputtering method will be described. Evaluation of a composite between nitride microcrystal 102 and amorphous nitride thin film 103 in the composite nitride-based film structure is performed by structure analysis with X-rays and by observing GaN which is grown by the MOCVD method having the composite nitride-based film structure as an initial substrate using an optical microscope.

Evaluation by X-rays will be described in detail. In structure analysis with X-rays, by determining a peak of X-rays rocking curve reflection of AlN (0002) as overlapping of a microcrystal-derived peak having a narrow width and an amorphous substance-derived peak having a wide width, and separating a microcrystal-derived peak and an amorphous substance-derived peak using a Gaussian function, using a method described in a document (Journal of Crystal Growth, 268 (2004), 1-7), it is possible to check presence of each of nitride microcrystal 102 and amorphous nitride thin film 103. Here, the width of X-rays peak cannot be represented by a specific numerical value, but among the separated two peaks, the peak relatively having a narrow width is associated with the microcrystal-derived peak and the peak having a wide width is associated with the amorphous substance-derived peak.

Subsequently, evaluation using an optical microscope will be described. Intervals between nitride microcrystals 102 cannot be evaluated with X-rays, and thus evaluated by MOCVD-growing GaN having the composite nitride-based film structure as an initial substrate, and observing a position at which crystal growth is proceeded using an optical microscope. In a case where the entire surface of the nitride thin film formed by the sputtering method is a crystal or an amorphous substance, GaN grown in a layer shape or polycrystalline GaN is supposed to grown, respectively. On the other hand, in a case where a composite of a microcrystal and an amorphous substance grows, in a microcrystal portion crystal growth in which a microcrystal becomes a crystal nucleus is easily proceeded, and thus a hexagonal prism-shaped crystal derived from the crystal structure of GaN is observed. With respect to this, in an amorphous portion, crystal growth is not proceeded, and thus none is observed. Accordingly, if a thin film prepared by the sputtering method is a composite of a microcrystal and an amorphous substance, optical microscope images arranged with an interval which is a hexagonal prism are observed.

Example 1

An examination result in Example 1 of the embodiment will be described below. In Example 1, film forming of a composite nitride-based film structure using Al as a target material and nitrogen as a reactive gas was performed using the sputtering method. A flow rate of nitrogen gas was controlled such that a film forming pressure was 0.45 Pa and a substrate temperature was constantly maintained at 400° C. by lamp heating. Power applied to a target for plasma discharge was 0.15 kW, and a pulse condition was that at a frequency of 10 kHz, a duty ratio at which power was applied was 5%. A film forming time was adjusted such that a film thickness of the composite nitride-based film structure on which film forming was performed was 20 nm.

Here, the film forming pressure may be a pressure as long as plasma discharge is caused, and may be 0.1 Pa to 1 Pa. It is desirable that the film forming pressure is 0.1 Pa to 0.5 Pa. If the film forming pressure is less than 0.1 Pa, there is a case where it is difficult to maintain plasma discharge, and a discharge failure is caused. If the film forming pressure exceeds 1 Pa, there is a case where film quality is deteriorated, for example, nitriding reaction due to reactive gas becomes insufficient and metal Al is precipitated. In the film forming, the film is completely nitrogenous, but Ar as a sputtering gas may be added, and it is desirable that nitrogen in the supplied gas type is within a range of 30% to 100%. When a proportion of nitrogen is less than 30%, nitriding reaction becomes insufficient, and there occur problems such as precipitation of metal Al due to nitriding failure or oxidation at the time of taking out a sample after film forming. A substrate temperature is any temperature as long as the temperature is 25° C. to 1000° C., and desirably is within a range of 25° C. to 600° C. At a temperature exceeding 1000° C. excessive crystallization is caused, and it is difficult to form a composite structure between microcrystal and amorphous substance. A lower limit temperature of 25° C. is a standard of room temperature, and may be lower than the room temperature.

In addition, regarding the pulse frequency of the power applied to the target for plasma discharge, on a low frequency side, for example, under a condition of less than 1 kHz, plasma discharge becomes extremely unreliable. In addition, on a high frequency side, for example, if the frequency exceeds 100 kHz, one period becomes 10 microseconds, and the duty ratio cannot be decreased to a desirable value by a regulation of a power device and the like. For this reason, it is considered that the frequency is appropriately 1 kHz to 100 kHz.

In addition, in order to achieve a purpose of instantaneously applying large power and producing atomic nitrogen or nitrogen in a radical state with high reactivity in nitrogen gas with high dissociation energy, it is desirable that the time of applying power in one period is short. However, when a proportion of the time applying power in one period is a duty ratio of less than 0.1%, it is in the middle of the rising of the power, and thus a time for reaching a set power is insufficient. In addition, from the vicinity where the proportion exceeds a duty ratio of 30%, the atomic nitrogen or nitrogen in a radical state capable of nitrogen gas being dissociated is decreased, and when the proportion is approximately a duty ratio of 50%, it becomes a situation not changed from normal direct current sputtering. Therefore, the proportion of the time of applying power in one period is appropriately a duty ratio of 0.1% to 30%. A film thickness of the composite nitride-based film structure is 1 nm to 100 nm, inclusive, and desirably 5 nm to 50 nm, inclusive. In a case where the film thickness is thinner than 1 nm, vanishing due to thermal decomposition occurs at the time of raising a temperature when performing crystal growth of a nitride semiconductor by the MOCVD method or HYPE having the composite nitride-based film structure as an underlayer. On the other hand, in a case where the film thickness is thicker than 100 nm, a density of the microcrystals becomes excessive or the orientation of the microcrystals becomes disordered, and thus functions of the composite nitride-based film structure as an underlayer are lost.

Figure 4:
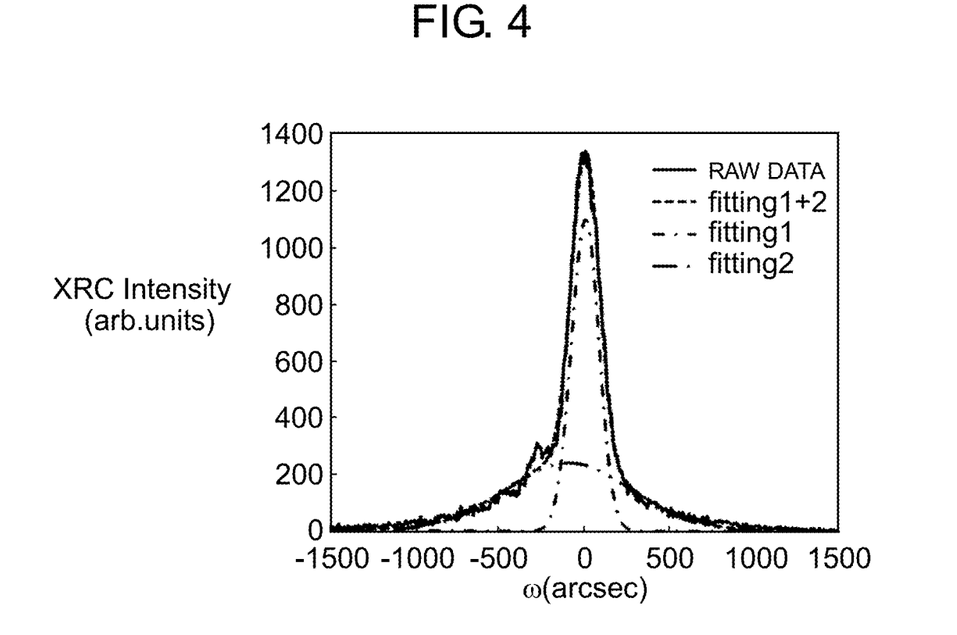
FIG. 4 is a view illustrating X-ray rocking curve reflection of an AlN (0002) plane which is a microcrystal of the composite nitride-based film structure according to the embodiment.

Subsequently, the evaluation result of the composite nitride-based film structure on which film forming is performed will be described. X-rays rocking curve measurement for the above-described purpose is performed on the composite nitride-based film structure prepared by the sputtering method, and a result obtained by separating a reflection peak of the obtained AlN (0002) plane into a microcrystal, amorphous substance-derived peak is illustrated in FIG. 4. The detailed method is as described above, and thus is omitted. Raw data, a one-dot chain line, and a two-dot chain line in which a solid line is obtained by X-rays measurement become microcrystal, amorphous substance-derived peaks obtained by fitting, respectively, and the dotted line represents a sum thereof. The raw data and the dotted line become an almost overlapping favorable fitting result, and is a result supporting that the composite nitride-based film structure on which film forming is performed by the sputtering method is a composite of a microcrystal and an amorphous substance.

Subsequently, a result obtained by performing film forming of GaN by the MOCVD method on the composite nitride-based film structure prepared by the sputtering method will be described. As group III raw materials, trimethyl gallium (TMG) was used, and as group V raw materials, $NH_3$ was used, respectively. TMG was supplied only by 23 sccm, and $NH_3$ was supplied only by 5 SLM, and a total flow in a reactor was diluted with hydrogen gas so as to be 50 SLM.

Figure 5:
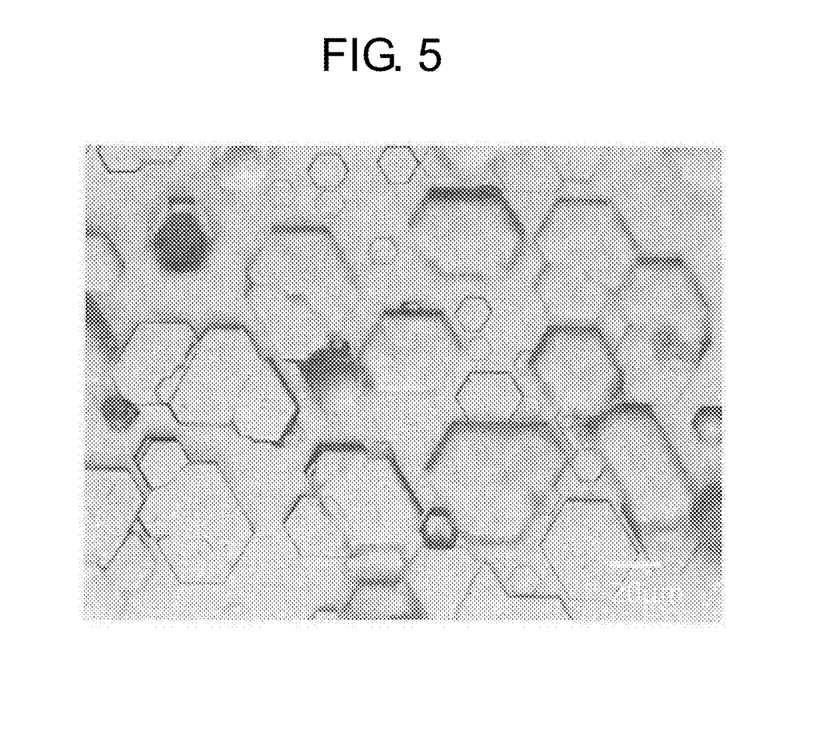
FIG. 5 is a view illustrating an optical microscope image of MOCVD-grown GaN on the composite nitride-based film structure according to the embodiment.

A substrate temperature was 1050° C., and GaN growth was performed for 60 minutes. An observation result of the obtained sample with an optical microscope is illustrated in FIG. 5. According to FIG. 5, GaN having a form of hexagon derived from a wurtzite structure was observed. In addition, observation by scanning electron microscope was performed, and it was recognized that a columnar crystal having a height of 1 μm to 20 μm, inclusive was obtained at an interval of 50 nm to 20 μm, inclusive. Since crystal growth of GaN was proceeded having a microcrystal as a starting point, it was recognized that the microcrystal in the composite nitride-based film structure formed on a bulk single crystal wafer was also scattered with an interval of 50 nm to 20 μm, inclusive. An interval of the microcrystal can be controlled by a film forming condition, and the interval (interval of adjacent nitride microcrystal) may be 5 nm to 50 μm, inclusive, and desirably 50 nm to 20 μm, inclusive. In a case where the interval is smaller than 5 nm, a bonding interface between crystals is defective at a time of performing crystal growth of a nitride semiconductor by the MOCVD method or the HVPE method thereafter, it is not possible to grow a high-quality crystal. On the other hand, if the interval between microcrystals is 50 μm or more, since a nitride semiconductor crystal growth having a microcrystal as a starting point at the time of performing crystal growth by the MOCVD method or the HVPE method cannot bind, it becomes a cause of generating significant defects such as a pitch or a micropipe. On the other hand, in a region where a hexagonal prism was not formed, growth of GaN was not checked and nucleation was not recognized. In this region, there was obtained a result supporting that the above-described single crystal bulk substrate was covered by an amorphous substance.

Accordingly, an observation result with an optical microscope of the sample in which GaN was grown by using the MOCVD method on the composite nitride-based film structure prepared by the sputtering method is a result supporting that the composite nitride-based film structure is a composite structure formed of a microcrystal and an amorphous substance.

According to the above-described embodiment, it was recognized that the composite nitride-based film structure formed of a microcrystal and an amorphous substance could be formed on a single crystal bulk substrate by using the sputtering method. Accordingly, it is possible to provide a composite nitride-based film structure and having the equal function to that of a processed substrate used in the ELO method by a one-stage step using an inexpensive sputtering method and a film forming method thereof.

The present disclosure includes an appropriate combination of optional embodiment and example in the above-described embodiment and example, and can exhibit an effect that the embodiment and example have, respectively.

By the composite nitride-based film structure and a method for manufacturing the same according to the present disclosure, it is possible to provide a base substrate for preparing a nitride crystal having crystal quality equal to that of a case where a nitride crystal was prepared by using the ELO method, without using film forming or light exposure step such as CVD or lithography.

INDUSTRIAL APPLICABILITY

The composite nitride-based film structure and the method for manufacturing the same according to the present embodiment can be used as an underlayer for growing a nitride semiconductor formed of a GaN, AlN, InN, and a mixed crystal thereof by the MOCVD or HVPE method and as a manufacturing method thereof. In addition, since the nitride semiconductor having the equal quality to that of the high-quality crystal prepared by the ELO method can be inexpensively, efficiently produced, the composite nitride-based film structure and the manufacturing method thereof are useful.

REFERENCE MARKS IN THE DRAWINGS

100 COMPOSITE NITRIDE-BASED FILM STRUCTURE
101 BULK SINGLE CRYSTAL WAFER
102 NITRIDE MICROCRYSTAL
103 AMORPHOUS NITRIDE THIN FILM
201 UNIT LATTICE (UNIT LATTICE OF SAPPHIRE)
202 UNIT LATTICE (UNIT LATTICE OF ALN)
300 SPUTTERING DEVICE
301 VACUUM CHAMBER
302 VACUUM PUMP
303 GATE VALVE
304 GAS SUPPLY SOURCE
305 SUBSTRATE HOLDER
306 SUBSTRATE
307 TARGET MATERIAL
308 BAKING PLATE
309 MAGNET
310 YOKE
330 DIRECT CURRENT POWER SOURCE
331 AMMETER
332 PULSED UNIT
340 POWER SOURCE CONTROLLER
341 PULSE CONTROLLER
601 BULK SINGLE CRYSTAL WAFER
602 CRYSTALLINE THIN FILM
603 MASK (AMORPHOUS MASK)
701 OPENING

The invention claimed is:

1. A composite nitride-based film structure comprising:
a bulk single crystal;
a plurality of nitride microcrystals provided on the bulk single crystal and having a specific orientation relationship with a crystal structure of the bulk single crystal; and
an amorphous nitride thin film provided on the bulk single crystal so as to surround the nitride microcrystals and cover a surface of the bulk single crystal,
wherein an upper surface of the composite nitride-based film structure is formed of an upper surface of the plurality of nitride microcrystals and an upper surface of the nitride thin film and is a flat surface.

2. The composite nitride-based film structure of claim 1, wherein an arithmetic average roughness of the upper surface of the composite nitride-based film structure ranges from 0.1 nm to 10 nm, inclusive.

3. The composite nitride-based film structure of claim 1, wherein the composite nitride-based film structure is formed of binary, or ternary or more elements in which one or more metal elements among Al, Ga, and In are nitrided.

4. The composite nitride-based film structure of claim 1, wherein in the plurality of nitride microcrystals, an interval between adjacent nitride microcrystals ranges from 5 nm to 50 μm, inclusive.

5. The composite nitride-based film structure of claim 1, wherein a film thickness of the composite nitride-based film structure ranges from 5 nm to 100 nm, inclusive.

6. The composite nitride-based film structure of claim 1, wherein the bulk single crystal is any one selected from the group consisting of sapphire ($\alpha$-$Al_2O_3$), Si, SiC, GaP, GaAs, ZnO, MgO, and $ScAlMgO_4$.

7. The composite nitride-based film structure of claim 1, wherein the specific orientation relationship is a relationship in which a direction of a crystal axis of the bulk single crystal coincides with a direction of a crystal axis of the plurality of nitride microcrystals.

8. The composite nitride-based film structure of claim 1, wherein the specific orientation relationship is a relationship in which a crystal axis of the plurality of nitride microcrystals is rotated by 30° with respect to a crystal axis of the bulk single crystal.

9. A method for manufacturing a composite nitride-based film structure comprising:
preparing a bulk single crystal substrate and a target material in a vacuum chamber of a sputtering device; and
introducing gas containing 30% or more of nitrogen in the vacuum chamber, applying a power pulse of which a proportion of time applying power at a frequency of 1 kHz to 100 kHz, inclusive ranges from 0.1% to 30%, inclusive, under a pressure of 0.1 Pa to 0.5 Pa, inclusive, and at a temperature of the bulk single crystal substrate of 25° C. to 1000° C., inclusive, to generate a plasma, and forming a plurality of nitride microcrystals and an amorphous nitride thin film surrounding the plurality of nitride microcrystals and covering entirely a surface of the bulk single crystal substrate, on the bulk single crystal substrate by a reactive sputtering method.

10. The method for manufacturing a composite nitride-based film structure of claim 9, wherein a pulsed direct current is supplied for generating the plasma when performing the reactive sputtering that forms a thin film on the bulk single crystal substrate by reacting the target material and gas.

* * * * *